(12) United States Patent
Tong

(10) Patent No.: US 9,852,961 B2
(45) Date of Patent: Dec. 26, 2017

(54) PACKAGED SEMICONDUCTOR DEVICE HAVING AN ENCAPSULATED SEMICONDUCTOR CHIP

(71) Applicant: Infineon Technologies AG, Neubiberg (DE)

(72) Inventor: Chong Yee Tong, Melaka (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/012,585

(22) Filed: Aug. 28, 2013

(65) Prior Publication Data

US 2015/0061108 A1    Mar. 5, 2015

(51) Int. Cl.
*H01L 23/34* (2006.01)
*H01L 23/36* (2006.01)
*H01L 23/31* (2006.01)
*H01L 23/433* (2006.01)
*H01L 23/495* (2006.01)
*H01L 23/00* (2006.01)

(52) U.S. Cl.
CPC ......... *H01L 23/36* (2013.01); *H01L 23/3107* (2013.01); *H01L 23/4334* (2013.01); *H01L 23/49513* (2013.01); *H01L 23/49562* (2013.01); *H01L 23/49575* (2013.01); *H01L 24/33* (2013.01); *H01L 2924/13055* (2013.01); *H01L 2924/181* (2013.01)

(58) Field of Classification Search
CPC . H01L 23/3107; H01L 23/4334; H01L 23/36; H01L 23/49513; H01L 23/49562; H01L 23/49575; H01L 24/33; H01L 2924/13055; H01L 2924/181
USPC ........................................................ 257/712
See application file for complete search history.

(56) References Cited

U.S. PATENT DOCUMENTS

| | | | | |
|---|---|---|---|---|
| 5,482,898 | A * | 1/1996 | Marrs | ................... 29/827 |
| 6,184,580 | B1 * | 2/2001 | Lin | ...................... 257/712 |
| 6,198,171 | B1 * | 3/2001 | Huang et al. | ............ 257/787 |
| 8,067,821 | B1 * | 11/2011 | Choi | ............ H01L 23/49541 |
| | | | | 257/666 |
| 8,232,634 | B2 * | 7/2012 | Takahashi et al. | ......... 257/698 |
| 2006/0038282 | A1 * | 2/2006 | Lange | ..................... 257/706 |
| 2007/0045785 | A1 * | 3/2007 | Noquil | .......... H01L 23/3107 |
| | | | | 257/666 |
| 2007/0090463 | A1 * | 4/2007 | Xiaochun | ........ H01L 23/3107 |
| | | | | 257/369 |

* cited by examiner

*Primary Examiner* — Trung Q Dang
*Assistant Examiner* — Patricia Reddington
(74) *Attorney, Agent, or Firm* — Murphy, Bilak & Homiller, PLLC

(57) ABSTRACT

A packaged semiconductor device includes a semiconductor component, first and second heat dissipation means disposed between the semiconductor component and the first and second main faces, respectively, encapsulated by an encapsulant, the shape of the packaged semiconductor device being non-rectangular cuboid.

6 Claims, 5 Drawing Sheets

PACKAGED SEMICONDUCTOR DEVICE HAVING AN ENCAPSULATED SEMICONDUCTOR CHIP

TECHNICAL FIELD

The present invention relates to a packaged device and a packaged semiconductor device.

BACKGROUND

The necessity to provide smaller, thinner, lighter and cheaper electronic systems with reduced power consumption, more diverse functionality and improved reliability has driven a stream of technological innovations in all technical fields involved. This is certainly also true for the areas of assembly and packaging which provide protective enclosure against mechanical and thermal outside influences, as well as chemical or irradiation-induced attacks.

BRIEF DESCRIPTION OF THE DRAWINGS

The accompanying drawings are included to provide a further understanding of embodiments and are incorporated in and constitute a part of this specification. The drawings illustrate embodiments and in combination with the description serve to explain principles of preferred embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Corresponding numerals in different figures indicate corresponding parts except where the context indicates otherwise. An index n refers to any particular one of several elements having designators or numerals suffixed with different values of a numerical suffix to which the index n refers. Corresponding designators differing by upper and lower case indicate corresponding parts, except where the context indicates otherwise.

DETAILED DESCRIPTION

Figure 1A:
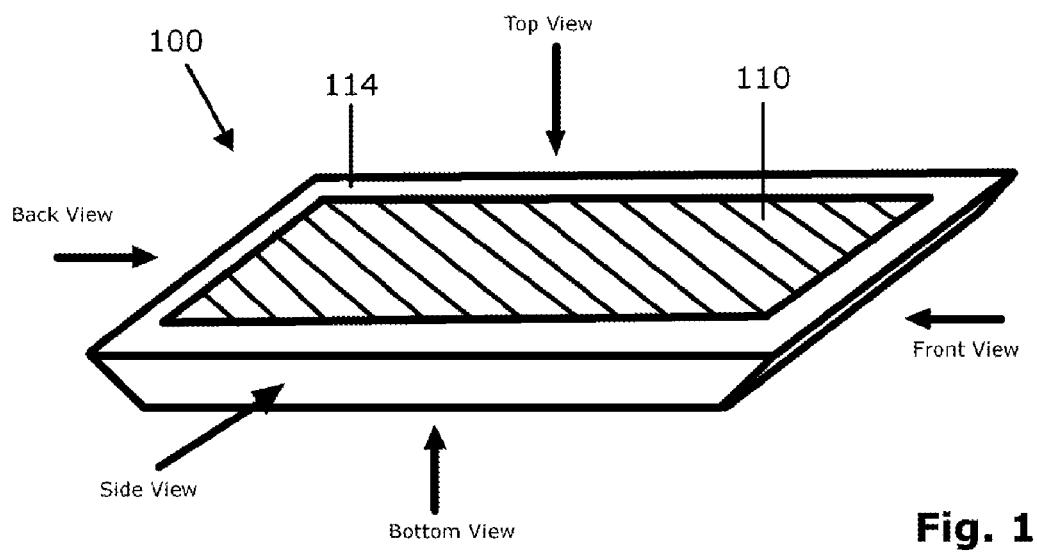
FIGS. 1a-1f show different views of the outside of a packaged semiconductor device according to the embodiments to be described in further detail.

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part thereof, and in which specific embodiments in which the invention may be practiced, are shown by way of illustration. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top", "bottom", "left", "right", "upper", "lower" etc., is used with reference to the orientation of the Figure(s) being described. Because components of embodiments can be positioned in a number of different orientations, the directional terminology is used for purposes of illustration only and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The embodiments of a chip module may use various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor chip(s) need not be manufactured from specific semiconductor material, for example Si, SiC, SiGe, GaAs, and, furthermore, may contain inorganic and/or organic materials that are not semiconductors, such as for example insulators, plastics or metals.

The semiconductor chip(s) considered herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used which result in inter-metallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip(s) may comprise a diffusion barrier. The diffusion barrier prevents in case of diffusion soldering that the solder material diffuses from the carrier into the semiconductor chip(s). A thin titanium layer on the contact element may, for example, affect such a diffusion barrier.

Connecting the semiconductor chip(s) to electric leads of the package may e.g. be done by attaching a clip to the contact pads of the semiconductor chip(s) or wire bonding. Wires that may be used for this may comprise for example one or more metal materials selected from the group of Au, Cu, Ag or alloys of one or more of these metals.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any suitable plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

According to an embodiment, the device is an encapsulated electronic component, such as one or more semiconductor chips, comprising a first main face and a second main face opposite the first main face.

According to an embodiment, the device comprises side walls which do not necessarily have to be perpendicular to the first and second main faces. In particular the angles between at least one of the side walls and the first and second main faces differs from 90°.

According to a preferred embodiment, one of the main faces of the device is bigger in size than the opposite main face, in a particular embodiment the first and second main faces are of same size.

According to an embodiment, the geometry of the device is non-rectangular cuboid.

According to a preferred embodiment, the device is of trapezoidal shape.

According to an embodiment, the device comprises one or more electronic components encapsulated in an encapsulation material.

According to an embodiment, the device comprises an interconnect element and/or wiring for electrically connecting the electronic component(s) to contact pads on one or more surfaces of the device.

According to an embodiment, the first heat dissipating means covers the maximal available and technically allowable area of the first main face.

According to an embodiment, the encapsulating material comprises an epoxy mold compound.

FIGS. 1a-1f show different views of a packaged semiconductor device 100 of non-rectangular cuboid shape, comprising a semiconductor chip (not shown) stacked between two heat dissipation means 110 and 120, is called double side cooling (DCS), and is especially suitable, if not required, for packaged devices with high power semiconductor chips and/or more than one thereof.

Figure 1B:
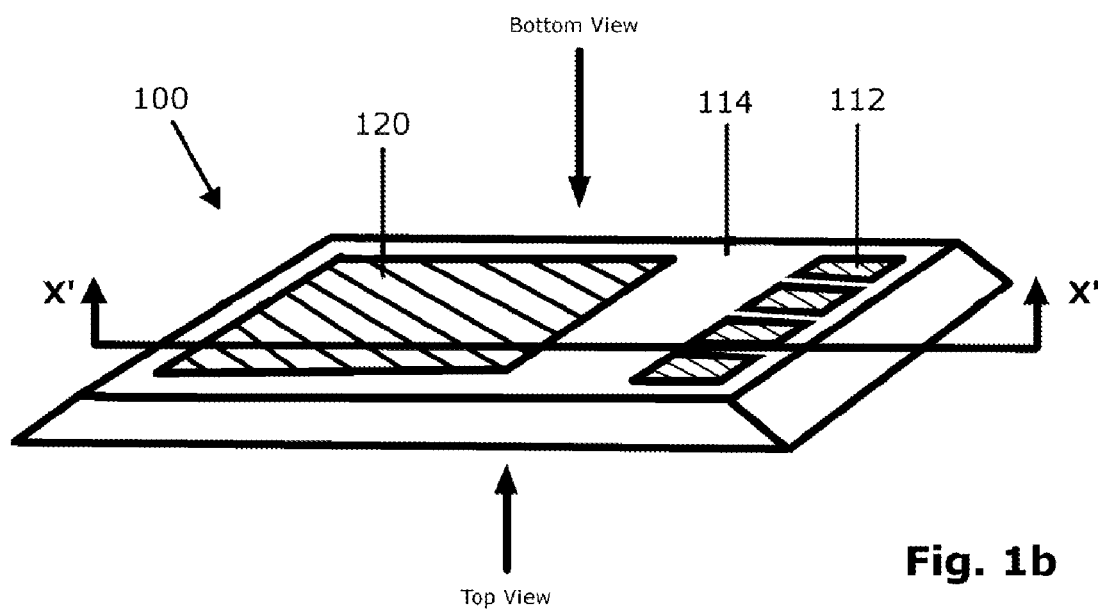

In particular, FIGS. 1a and 1b depict a perspective top and bottom view, respectively, of the shape of the packaged device 100. The packaged device 100 comprises a first heat dissipating means, in particular a heat sink 110, on the first main face (top surface) of the packaged device and a second heat dissipating means, heat sink 120, on the second main face (bottom surface) for heat dissipation purposes. Further, the device comprises one or more electric leads 112 on the bottom surface, which are meant to connect the electric component (not shown) inside the packaged device to e.g. surrounding components, modules or circuit boards. All components are embedded in an encapsulant 114, which may for example comprise or consist of a laminate, an epoxy resin or any other suitable kind of material.

Figure 1C:
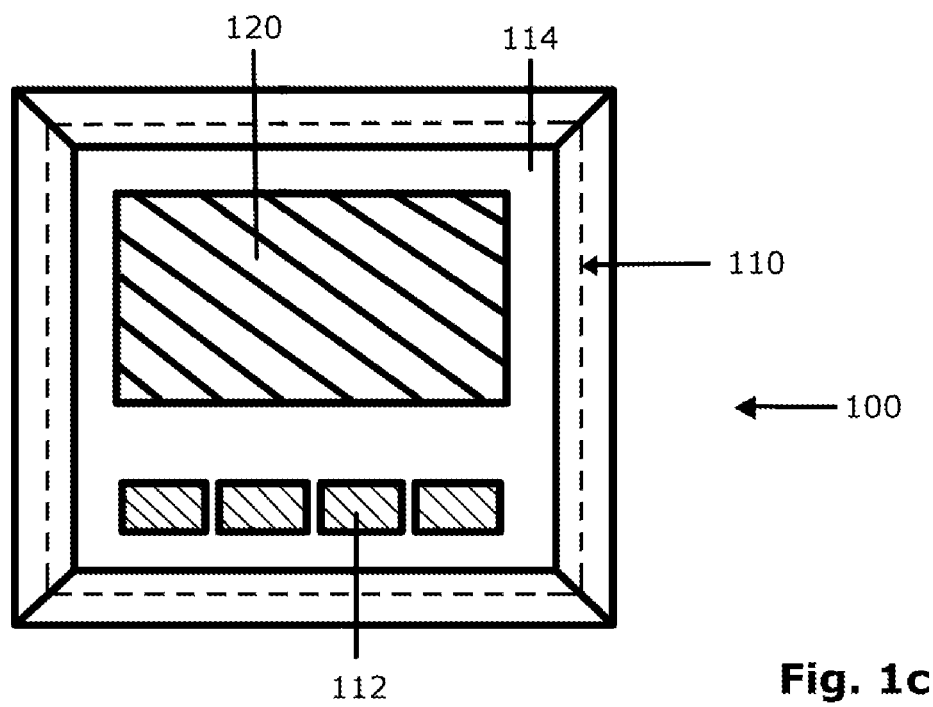
Figure 1D:
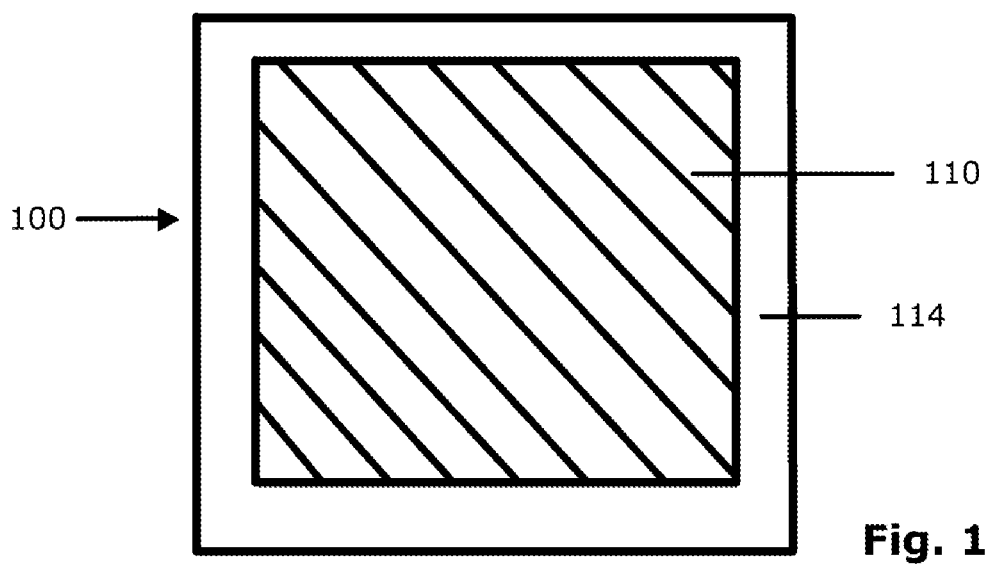

FIGS. 1c and 1d depict another view of the top and bottom surfaces of the packaged device with first and second heat sinks 110 and 120 as well as the electric leads 112 enclosed by the encapsulating material 114.

Figure 1E:
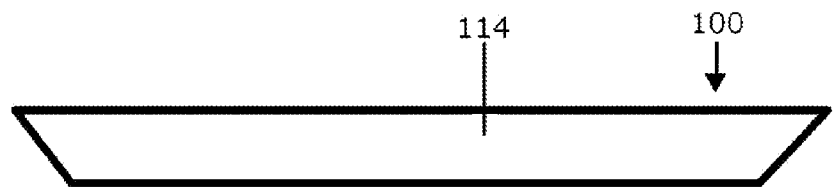
Figure 1F:
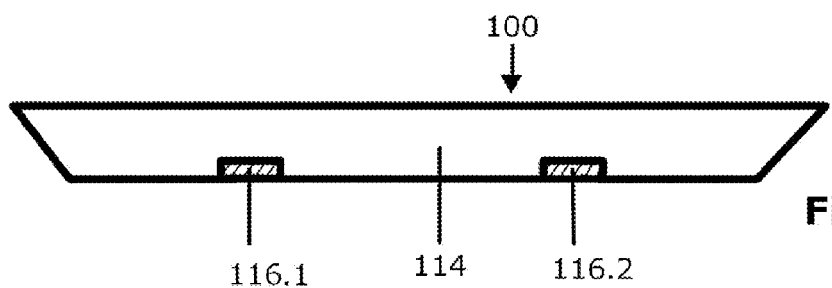

FIGS. 1e and 1f depict a front/back view and a side view of the packaged device, respectively, as indicated by the arrows in FIG. 1a. FIG. 1f further shows tie-bars 116.i (i=1, 2), which are parts of the leadframe needed to hold the bottom heat sink 120 in its place while it is still in leadframe strip form.

Figure 2A:
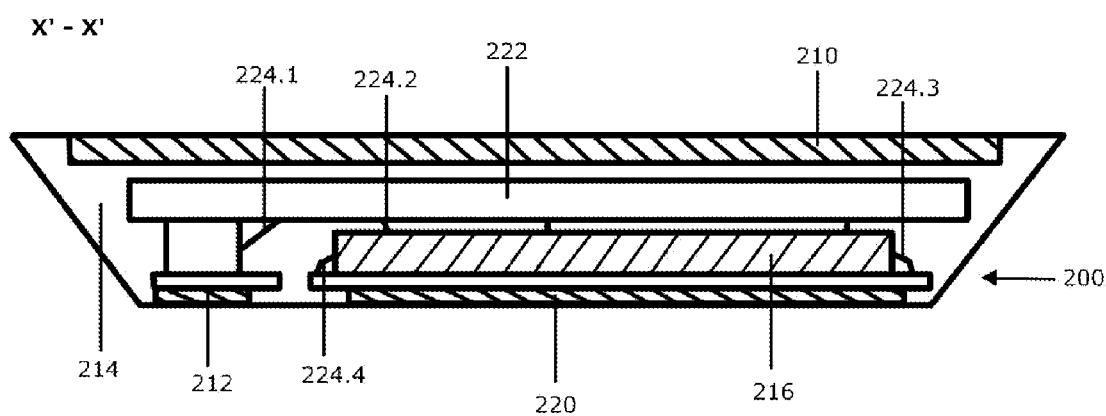
FIGS. 2a and 2b depict a cross-sectional view of the device according to an embodiment in which a single semiconductor chip is comprised in the packaged device.
Figure 2B:
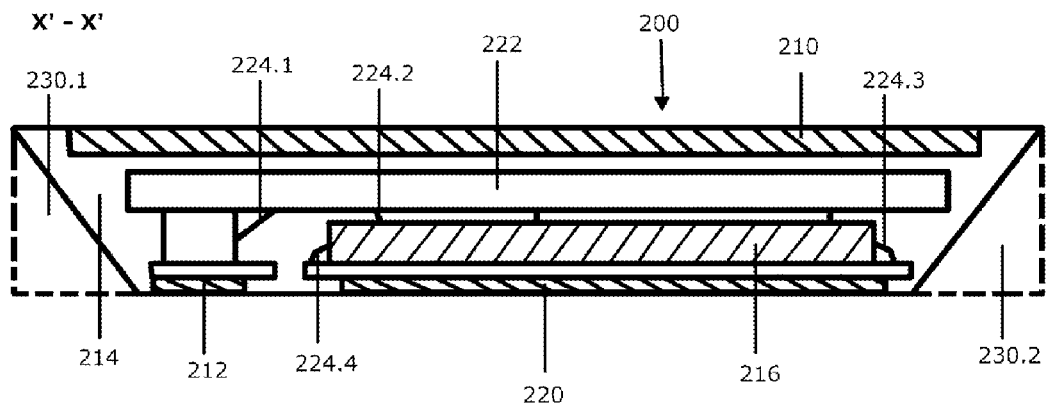

FIGS. 2a and 2b show a cross-sectional view of an embodiment of the packaged semiconductor device 200 along the line X'-X' indicated in FIG. 1b. A semiconductor chip 216 is attached to a die attach region, which in this embodiment is the second heat sink 220 at the bottom surface of the device 200. This chip is connected to the electric leads 212 and the second heat sink 220 by an interconnect element 222 and/or diverse wires, especially bonding wires 224.n, (n=1-4). The first heat sink 210 is placed on top of the interconnect element 222 at the top surface of the packaged device.

The first heat sink 210 covers a much larger area of the top surface of the packaged device 200 than the second heat sink 220 placed at the bottom surface of the device. In fact, the size of the first heat sink is only limited by the available amount of space at the top surface and technical restrictions, thus providing a maximum size of the heat sink 210 for optimum heat dissipation and package cooling effect, while the size of the pin mounting area at the bottom surface of the device 200 remains unchanged.

By using this package design with its first heat sink 210 enlarged in comparison to its second heat sink 220, the shape of the finished product does not necessarily have to be rectangular cuboid. In fact, if a package design like the one described in this embodiment with its maximized top surface heat dissipation area 210 were to be encapsulated in a standard rectangular cuboid geometry, not only the bottom surface of the device 200 would be enlarged, thus not maintaining the desired size of the pin mounting area and requiring circuit boards with different layouts and/or dimensions, but furthermore non-negligible amounts of encapsulant material 214 would be wasted and thus raising the cost of the finished device.

Due to this, the packaged device 200 is adapted to be of non-rectangular cuboid geometry, preferably a reverse trapezoid shape with its top surface having a larger area than its bottom surface, to combine the advantages of a maximized heat dissipation area 210 on top of the package and maintaining the same size of the pin mounting area at the bottom of the device. Another significant advantage of this reverse trapezoid design of the packaged device 200 is the reduced material cost in manufacturing the device, and thus the total cost of the finished product, caused by cutting down the amount of encapsulating material 214 used.

Figure 3:
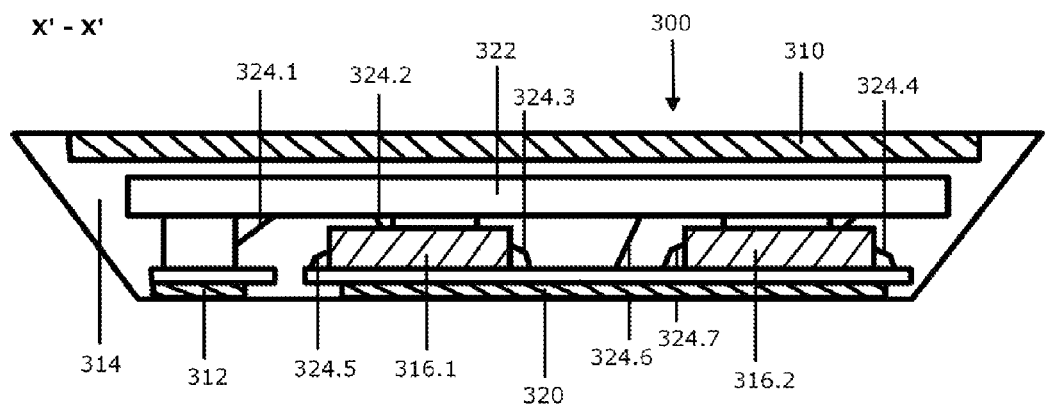
FIG. 3 shows a cross-sectional view of the device according to an embodiment in which the packaged device comprises more than one semiconductor chip.

Furthermore, shown in particular in FIG. 3, the reversed trapezoid geometry of the packaged device can be used for the manufacture of packaged devices 300 comprising more than one electronic component, as for example two semiconductor chips 316.n (n=1, 2). Because of the enlarged area of the top surface heat sink 310, the heat produced by the more than one semiconductor chip 316.n can easily be dissipated. Similar to the device depicted in the embodiment of FIG. 2, the semiconductor chips 316.n (n=1-6) can be electrically and mechanically connected to the leads 312 and the bottom heat dissipating means 320 via an interconnect element 322 and/or multiple wires, e.g. bonding wires 324.1, 324.2, 324.3, 324.4, 324.5, 324.6 and 324.7.

The dissipation of the heat produced by the multiple semiconductor chips 316.1 sand 316.2 encapsulated in the device 300 by an encapsulating material 314 is facilitated by the maximized area of the heat sink 10 on top of a packaged device 300 with a reverse trapezoid geometry, while the pin mounting area on the bottom side of the device 300 remains unchanged, thus enabling more powerful devices to be manufactured without the need to change the layout or dimension of a circuit board to which the device is to be mounted, while at the same time, using a lesser amount of encapsulation material per device reduces the cost of the packaged devices.

Figure 4A:
FIGS. 4a and 4b show a side view and a cross-sectional view of an embodiment in which at least one of the side walls is not perpendicular to the first and second main surfaces of the device.

FIG. 4a depicts a side view of the device according to an embodiment in which at least one of the side walls remains perpendicular to the first and second main faces of the device, while at least one of the other side walls is angled between the first and second main faces with an angle different from 90°. The numerals in this Figure are analog to the ones in FIG. 1f, with 400 being the device, 414 being the encapsulant, and 416.n being the tie-bars, wherein n=1, 2.

Figure 4B:
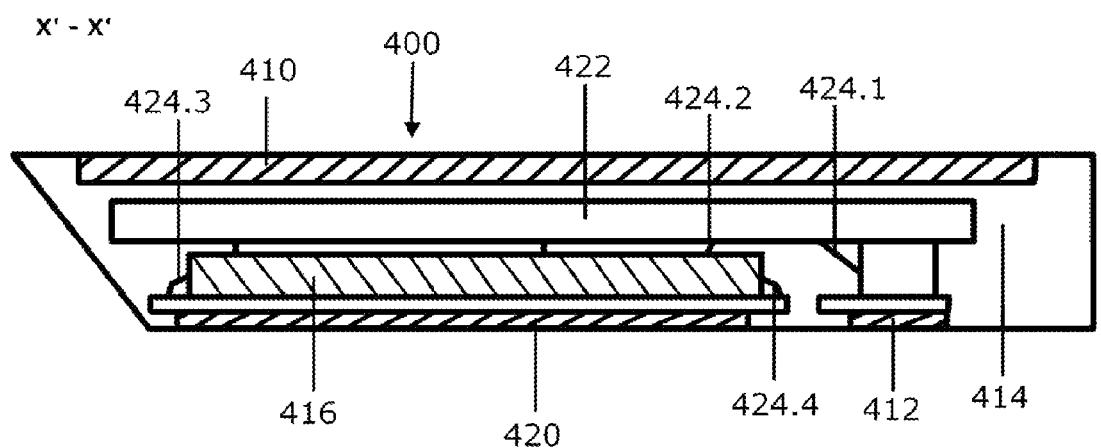

FIG. 4b shows a cross-sectional view of the device along the lines X'-X' of FIG. 1a, the difference being, as indicated in FIG. 4a, that at least one of the side walls is angled between the first and second main faces with an angle different from 90°, while at least one of the other side walls remains perpendicular to the first and second main faces of the device. The numerals are analog to the ones in the previous Figures, with 400 being the device, 410 being the top heat sink, 412 being an electric lead, 414 being the encapsulating material, 416 depicting the semiconductor chip, 420 being the bottom heat sink, 422 being the interconnect element, and 424.n showing the multiple wires, wherein n=1-4.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A packaged electronic device, comprising:
   an electronic component;
   an encapsulation material covering the electronic component, the encapsulation material comprising a first main face, a second main face opposite the first main face;
   side walls that are not perpendicular to the first and second main faces and oriented in such a way that the first main face is bigger in size than the second main face;
   a first heat dissipating means disposed between the electronic component and the first main face;
   a plurality of external electrical contact elements arranged on the second main face of the encapsulation material, wherein the external contact elements arranged on the second main face of the encapsulation material in such a way that the contact elements are enclosed by the encapsulation material and are positioned entirely within an outline of the second main face of the electronic device, and the external surfaces of the contact elements are flush with the second main face of the encapsulation material;
   a contact clip for electrically contacting the electronic component to at least one of the plurality of external electrical contact elements, the contact clip being disposed between the first heat dissipating means and the electronic component, wherein the contact clip is entirely enclosed by the encapsulation material, and
   a second heat dissipation means disposed between the electronic component and the second main face,
   wherein the first heat dissipating means is electrically insulated from the electronic component, contact clip and the external contact elements.

2. The packaged electronic device according to claim 1, wherein the first heat dissipation means covers the maximum available and technically allowable area of the main face of the packaged semiconductor device.

3. The packaged electronic device according to claim 1, wherein the shape of the encapsulated packaged electronic device is trapezoidal.

4. The packaged electronic device according to claim 1, wherein the encapsulation material comprises an epoxy mold compound.

5. The packaged electronic device according to claim 1, wherein the electronic component comprises one or more electronic components.

6. The packaged electronic device according to claim 1, wherein the plurality of external electrical contact elements is disposed adjacent to and spaced apart from the second heat dissipation means.

* * * * *